(12) United States Patent
Kim et al.

(10) Patent No.: US 9,424,770 B2
(45) Date of Patent: Aug. 23, 2016

(54) ERROR COMPENSATOR AND ORGANIC LIGHT EMITTING DISPLAY DEVICE USING THE SAME

(71) Applicant: SAMSUNG DISPLAY CO., LTD., Yongin, Gyeonggi-Do (KR)

(72) Inventors: Bo-Yeon Kim, Yongin (KR); Oh-Jo Kwon, Yongin (KR); Hee-Sun Ahn, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 13/941,356

(22) Filed: Jul. 12, 2013

(65) Prior Publication Data

US 2014/0152642 A1   Jun. 5, 2014

(30) Foreign Application Priority Data

Dec. 3, 2012  (KR) .................. 10-2012-0139059

(51) Int. Cl.
*G09G 3/32* (2016.01)
*H03K 17/30* (2006.01)

(52) U.S. Cl.
CPC ............ *G09G 3/3208* (2013.01); *G09G 3/3233* (2013.01); *H03K 17/30* (2013.01); *G09G 3/3291* (2013.01); *G09G 2300/0842* (2013.01); *G09G 2320/0295* (2013.01); *G09G 2320/043* (2013.01); *G09G 2320/045* (2013.01)

(58) Field of Classification Search
None
See application file for complete search history.

(56) References Cited

U.S. PATENT DOCUMENTS

| 6,088,057 | A | 7/2000 | Hieda |
| 7,259,632 | B1 * | 8/2007 | LeBoeuf, II ................. 330/310 |
| 2001/0008422 | A1 | 7/2001 | Mizuno et al. |
| 2002/0190193 | A1 | 12/2002 | Mizuno et al. |
| 2007/0081410 | A1 * | 4/2007 | Bernstein et al. ........ 365/230.03 |
| 2009/0160740 | A1 | 6/2009 | Leon et al. |

(Continued)

FOREIGN PATENT DOCUMENTS

| KR | 10-2011-0100219 | 9/2011 |
| KR | 10-2011-0104705 | 9/2011 |

OTHER PUBLICATIONS

EP Search Report dated Feb. 4, 2014, for corresponding European Patent application 13186135.3, (8 pages).

(Continued)

*Primary Examiner* — Kent Chang
*Assistant Examiner* — Nathan Brittingham
(74) *Attorney, Agent, or Firm* — Lewis Roca Rothgerber Christie LLP

(57) ABSTRACT

An error compensator and an organic light emitting display device using the same. The organic light emitting display device includes pixels each having a driving transistor and an organic light emitting diode; and a sensing unit extracting at least one of a first information including the threshold voltage of the driving transistor or a second information including the degradation of the organic light emitting diode from a pixel of the pixels. In the organic light emitting display device, the sensing unit includes an amplifier amplifying a voltage corresponding to the at least one of the first information or the second information; and an error compensator compensating for error components of elements included in the amplifier and the error compensator.

26 Claims, 7 Drawing Sheets

(56) References Cited

U.S. PATENT DOCUMENTS

| | | |
|---|---|---|
| 2009/0167644 A1 | 7/2009 | White et al. |
| 2010/0156766 A1 | 6/2010 | Levey et al. |
| 2011/0007067 A1 | 1/2011 | Ryu et al. |
| 2011/0130981 A1 | 6/2011 | Chaji et al. |
| 2011/0227505 A1 | 9/2011 | Park et al. |
| 2011/0304489 A1* | 12/2011 | Christer et al. ............... 341/118 |
| 2012/0104235 A1 | 5/2012 | Sumi et al. |

OTHER PUBLICATIONS

EPO Search Report dated Jun. 22, 2016, for corresponding European Patent application 16166735.7, (8 pages).

* cited by examiner

ERROR COMPENSATOR AND ORGANIC LIGHT EMITTING DISPLAY DEVICE USING THE SAME

CROSS-REFERENCE TO RELATED APPLICATION

This application claims priority to and the benefit of Korean Patent Application No. 10-2012-0139059, filed on Dec. 3, 2012, in the Korean Intellectual Property Office, the entire content of which is incorporated herein by reference.

BACKGROUND

1. Field

The following description relates to an error compensator and an organic light emitting display device using the same.

2. Description of the Related Art

Various types of flat panel display devices have been developed which reduce weight and volume as compared with cathode ray tubes. These flat panel display devices include a liquid crystal display, a field emission display, a plasma display panel, an organic light emitting display device, and the like.

Among these flat panel display devices, the organic light emitting display device displays images using organic light emitting diodes that emit light through recombination of electrons and holes. The organic light emitting display device has a fast response speed and is driven with low power consumption.

SUMMARY

Aspects of embodiments of the present invention are directed toward an error compensator that can improve image quality and an organic light emitting display device using the same.

Aspects of embodiments are directed toward an error compensator and an organic light emitting display device using the same, which can exactly extract information on the degradation of an organic light emitting diode and the threshold voltage of a driving transistor.

Embodiments also provide an error compensator and an organic light emitting display device using the same, which can exactly extract information on the degradation of an organic light emitting diode and the threshold voltage of a driving transistor, in which data is changed using extracted information, so that it is possible to display an image with improved image quality, regardless of the degradation of an organic light emitting diode and the threshold voltage of a driving transistor.

According to an embodiment of the present invention, an organic light emitting display device is provided to include: pixels each having a driving transistor and an organic light emitting diode; and a sensing unit extracting at least one of a first information including the threshold voltage of the driving transistor or a second information including the degradation of the organic light emitting diode from a pixel of the pixels, wherein the sensing unit includes: an amplifier amplifying a voltage corresponding to the at least one of the first information or the second information; and an error compensator compensating for error components of elements included in the amplifier and the error compensator.

The error components may include offset characteristics, noises and line resistances of the elements. The amplifier may include an eleventh transistor having a second electrode coupled to the pixel, having a first electrode coupled to, a ground power source, and having a gate electrode coupled to the second electrode so that current flows from the pixel to the ground power source; a twelfth transistor coupled in the form of a current mirror to the eleventh transistor; and a current supply unit supplying a reference current to the eleventh transistor. The twelfth transistor may be formed to have a channel width wider than that of the eleventh transistor. The reference current may be set to have a current value lower than that of a second current to be flowed in the twelfth transistor, the second current mirroring a first current supplied to the eleventh transistor. A common terminal of the current supply unit and the twelfth transistor may be coupled to the error compensator.

The amplifier may further include a twentieth switch positioned between the gate electrode and the second electrode of the eleventh transistor; a twenty-first switch coupled between the ground power source and the gate electrodes of the eleventh and twelfth transistors; and a twenty-second switch coupled between the pixel and the common terminal of the current supply unit and the twelfth transistor. The twentieth transistor may be turned on during a period in which the first information is extracted, and the twenty-first and twenty-second switches may be turned on during a period in which the second information is extracted.

The error compensator may include a first operational amplifier (OP-AMP) and a second OP-AMP; a first switch and a first capacitor, coupled in parallel between a first input terminal and an output terminal of the first OP-AMP; a second switch coupled between a first input terminal and an output terminal of the second OP-AMP; a third switch coupled between the first input terminal and the amplifier; a fourth switch coupled between an external analog-digital converter and the output terminal of the second OP-AMP; a first storage unit coupled between the output terminal of the first OP-AMP and the first input terminal of the second OP-AMP; and a second storage unit coupled between the first input terminal and the output terminal of the second OP-AMP.

A first reference power source may be supplied to a second input terminal of the first OP-AMP, and a second reference power source may be supplied to a second input terminal of the second OP-AMP. The first storage unit may include a fifth switch, a third capacitor and a sixth switch, coupled in series between the output terminal of the first OP-AMP and the first input terminal of the second OP-AMP; and a seventh switch, a fourth capacitor and an eighth switch, coupled in parallel to the fifth switch, the third capacitor and the sixth switch between the output terminal of the first OP-AMP and the first input terminal of the second OP-AMP. The fifth and sixth switches may be turned on during a first period in the period in which the first and second switches are turned on, and the seventh and eighth switches may be turned on during a second period not overlapping with the first period in the period in which the first and second switches are turned on. The fourth switch may also be set to be in a turn-on state during the first and second periods.

The second storage unit may include a second capacitor coupled between tenth and eleventh nodes; a ninth switch coupled between the eleventh node and the first input terminal of the second OP-AMP; a tenth switch coupled between the tenth node and the output terminal of the second OP-AMP; an eleventh switch coupled between the tenth node and the first input terminal of the second OP-AMP; and a twelfth switch coupled between the eleventh node and the output terminal of the second OP-AMP. The fifth switch, the sixth switch, the ninth switch and the tenth switch may be turned on during a third period in the period in which the third switch is turned on, and the seventh switch, the eighth switch, the eleventh switch and the twelfth switch may be turned on during a fourth period not overlapping with the third period in the period in which the third switch is turned on. The fourth period may be set to be longer than the third period.

The fourth switch, the eleventh switch and the twelfth switch may be turned on during a period posterior to the fourth period.

The organic light emitting display device may further include a data driver supplying a data signal to data lines coupled to the pixels; a scan driver supplying a scan signal to scan lines coupled to the pixels; and a timing controller changing bits of data supplied from the outside thereof and provides the data driver with the changed bits, corresponding to the at least one of the first information or the second information. The sensing unit may further include an analog-digital converter converting a voltage supplied from the error compensator into a digital value; and a memory storing the digital value, and providing the stored value to the timing controller so that the bits of the data are changed. Each pixel may include a transistor coupled between the sensing unit and a common node between the driving transistor and the organic light emitting diode, and turned on during the period in which the at least one of the first information or the second information is extracted.

According to an embodiment of the present invention, there is provided an error compensator, including: a first OP-AMP and a second OP-AMP; a first switch and a first capacitor, coupled in parallel between a first input terminal and an output terminal of the first OP-AMP; a second switch coupled between a first input terminal and an output terminal of the second OP-AMP; a first storage unit coupled between the output terminal of the first OP-AMP and the first input terminal of the second OP-AMP, and changing a voltage at the output terminal of the first OP-AMP and supplying the changed voltage to the first input terminal of the second OP-AMP; and a second storage unit coupled between the first input terminal and the output terminal of the second OP-AMP.

A first reference power source may be supplied to a second input terminal of the first OP-AMP, and a second reference power source may be supplied to a second input terminal of the second OP-AMP. The first input terminal may be a negative (−) input terminal, and the second input terminal may be a positive (+) input terminal. The first storage unit may include a fifth switch, a third capacitor and a sixth switch, coupled in series between the output terminal of the first OP-AMP and the first input terminal of the second OP-AMP; and a seventh switch, a fourth capacitor and an eighth switch, coupled in parallel to the fifth switch, the third capacitor and the sixth switch between the output terminal of the first OP-AMP and the first input terminal of the second OP-AMP. The fifth and sixth switches may be turned on during a first period in the period in which the first and second switches are turned on, and the seventh and eighth switches may be turned on during a second period not overlapping with the first period in the period in which the first and second switches are turned on. The second storage unit may include a second capacitor coupled between tenth and eleventh nodes; a ninth switch coupled between the eleventh node and the first input terminal of the second OP-AMP; a tenth switch coupled between the tenth node and the output terminal of the second OP-AMP; an eleventh switch coupled between the tenth node and the first input terminal of the second OP-AMP; and a twelfth switch coupled between the eleventh node and the output terminal of the second OP-AMP. After a predetermined voltage is charged in the third and fourth capacitors, the fifth switch, the sixth switch, the ninth switch and the tenth switch may be turned on so that a voltage is primarily stored in the second capacitor, and the seventh switch, the eighth switch, the eleventh switch and the twelfth switch may be turned on so that a voltage is secondarily stored in the second capacitor.

In the error compensator and the organic light emitting display device according to an embodiment of the present invention, error components of external compensation elements are removed using an error compensator, and accordingly, it is possible to exactly extract information corresponding to the threshold voltage of a driving transistor and the degradation of an organic light emitting diode included in each pixel.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
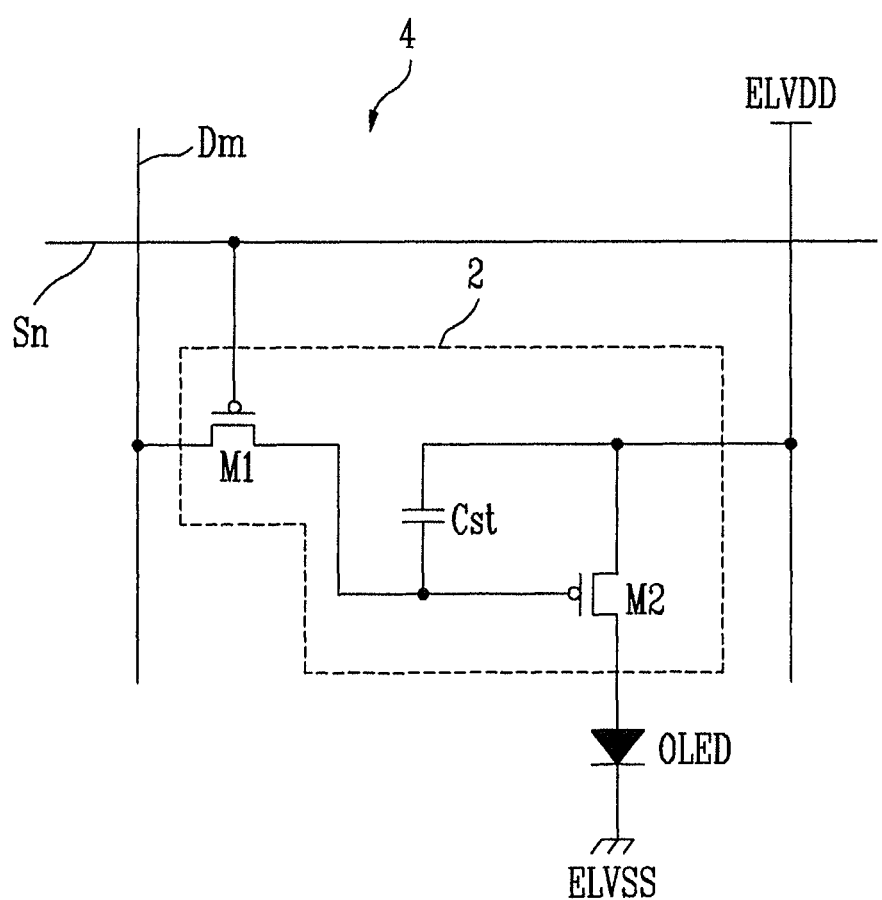
FIG. 1 is a circuit diagram illustrating a pixel of a related art organic light emitting display device.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via one or more third elements. Further, some of the elements that are not essential to the complete understanding of the invention are omitted for clarity. Also, like reference numerals refer to like elements throughout.

FIG. 1 is a circuit diagram illustrating a pixel of a related art organic light emitting display device.

Referring to FIG. 1, the pixel 4 of the related art organic light emitting display device includes an organic light emitting diode OLED, and a pixel circuit 2 coupled to a data line Dm and a scan line Sn so as to control the organic light emitting diode OLED.

An anode electrode of the organic light emitting diode OLED is coupled to the pixel circuit 2, and a cathode electrode of the organic light emitting diode OLED is coupled to a second power source ELVSS. When a scan signal is supplied to the scan line Sn, the pixel circuit 2 controls the amount of current supplied to the organic light emitting diode OLED, corresponding to a data signal supplied to the data line Dm. To this end, the pixel circuit 2 includes a second transistor M2 coupled between a first power source ELVDD and the organic light emitting diode OLED, a first transistor M1 coupled with the second transistor M2, the data line Dm and the scan line Sn, and a storage capacitor Cst coupled between a gate electrode and a first electrode of the second transistor M2.

A gate electrode of the first transistor M1 is coupled to the scan line Sn, and a first electrode of the first transistor M1 is coupled to the data line Dm. A second electrode of the first transistor M1 is coupled to one terminal of the storage capacitor Cst. Here, the first electrode is referred to as any one of source and drain electrodes, and the second electrode is set as an electrode different from the first electrode. For example, if the first electrode is referred to as a source electrode, then the second electrode is referred as a drain electrode. When the scan signal is supplied to the scan line Sn, the first transistor M1 coupled to the scan line Sn and the data line Dm is turned on to supply the data signal supplied from the data line Dm to the storage capacitor Cst. In this case, the storage capacitor Cst charges to a voltage corresponding to the data signal.

The gate electrode of the second transistor M2 is coupled to the one terminal of the storage capacitor Cst, and the first electrode of the second transistor M2 is coupled to the other terminal of the storage capacitor Cst and the first power source ELVDD. A second electrode of the second transistor M2 is coupled to the anode electrode of the organic light emitting diode OLED. The second transistor M2 controls the amount of current flowing from the first power source ELVDD to the second power source ELVSS via the organic light emitting diode OLED, corresponding to the voltage stored in the storage capacitor Cst. In this case, the organic light emitting diode OLED generates light corresponding to the amount of current supplied from the second transistor M2.

However, the organic light emitting display device has a problem in that an image with uniform luminance is not displayed by degradation of the organic light emitting diode OLED and a variation in threshold voltage of the second transistor M2. In order to solve such a problem, there has been proposed a method of compensating for the degradation of the organic light emitting diode OLED and the threshold voltage of the second transistor M2 from the outside of the pixel 4. However, in the method of compensating for the degradation and the threshold voltage from the outside using micro-current flowing in the pixel 4, exact information is not extracted by offsets and noises of elements included in an external compensation circuit, and therefore, exact compensation is not made.

Figure 2:
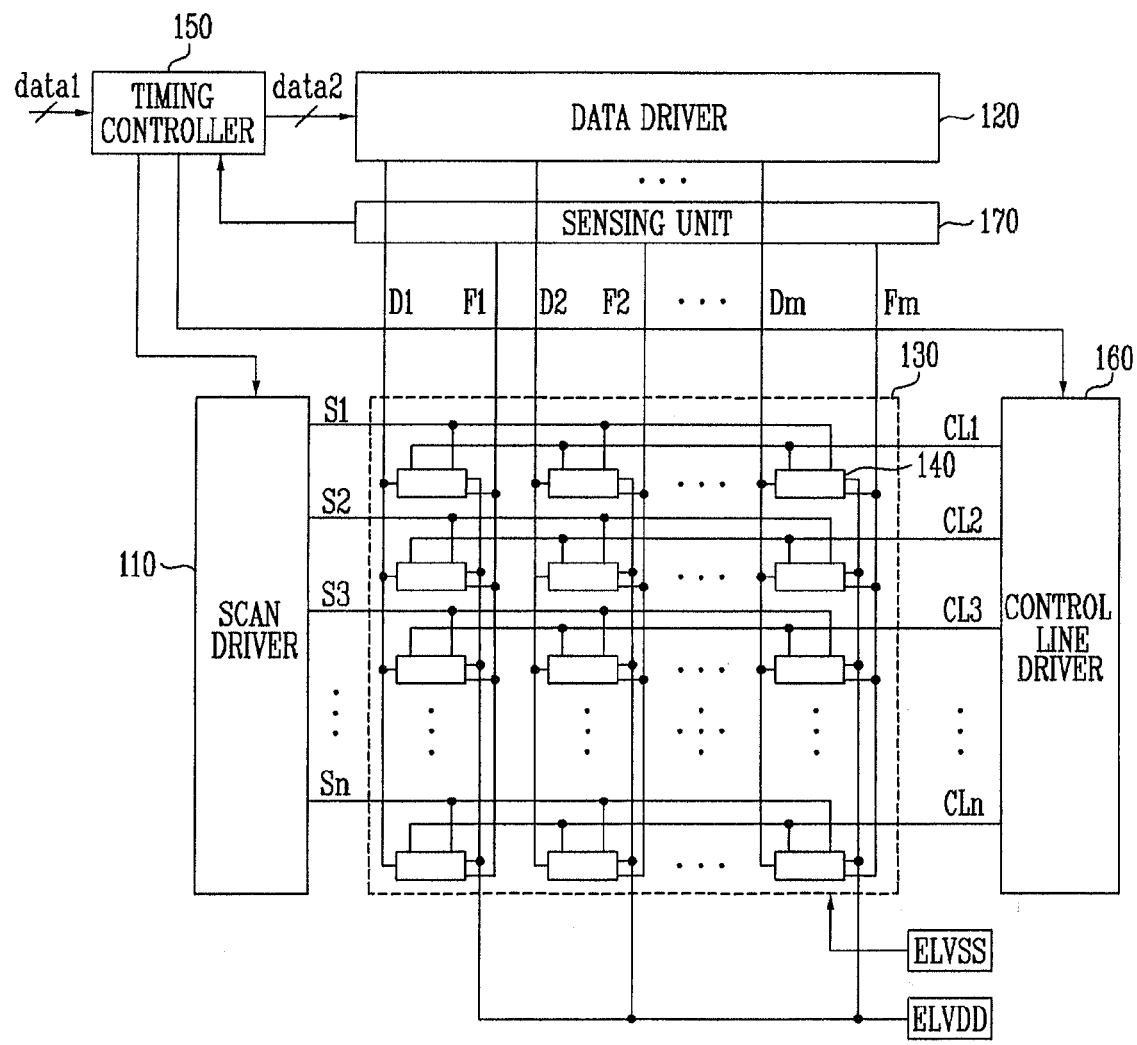
FIG. 2 is a block diagram illustrating an organic light emitting display device according to an embodiment of the present invention.

FIG. 2 is a block diagram illustrating an organic light emitting display device according to an embodiment of the present invention.

Referring to FIG. 2, the organic light emitting display device according to this embodiment includes a pixel unit 130 having pixels 140 positioned at intersection portions (crossing regions) of scan lines S1 to Sn and data lines D1 to Dm, a scan driver 110 driving the scan lines S1 to Sn, a data driver 120 driving the data lines D1 to Dm, a control line driver 160 driving control lines CL1 to CLn, and a timing controller 150 controlling the scan driver 110, the data driver 120 and the control line driver 160.

The organic light emitting display device according to this embodiment further includes a sensing unit 170 extracting threshold voltage information of a driving transistor and/or degradation information of an organic light emitting diode included in each pixel 140, using feedback lines F1 to Fm.

The pixel unit 130 includes the pixels 140 positioned at intersection portions (crossing regions) of the scan lines S1 to Sn and the data lines D1 to Dm. Each pixel 140 provides the sensing unit 170 with the threshold voltage information of the driving transistor and/or the degradation information of the organic light emitting diode during a sensing period. Each pixel 140 receives a data signal input during a driving period, and generates light with a set or predetermined luminance while controlling the amount of current supplied from a first power source ELVDD to a second power source ELVSS via the organic light emitting diode, corresponding to the received data signal.

The scan driver 110 supplies a scan signal to the scan lines S1 to Sn. For example, the scan driver 110 progressively supplies the scan signal to the scan lines S1 to Sn during the sensing and driving periods.

The data driver 120 receives a second data data2 supplied during the driving period, and generates a data signal using the supplied second data data2. The data signal generated in data driver 120 is supplied to the data lines D1 to Dm in synchronization with the scan signal. The data driver 120 may supply a specific data signal in synchronization with the scan signal during the sensing period. Here, the specific data signal is used to extract threshold voltage information of the driving transistor included in each pixel 140, and may be set to any one of various gray scale values.

The control line driver 160 supplies a control signal to the control lines CL1 to CLn during the sensing period. For example, the control line driver 160 may progressively supply a control signal to the control lines CL1 to CLn during the sensing period. If the data signal is progressively supplied to the control lines CL1 to CLn, pixels 140 for each horizontal line are coupled to the feedback lines F1 to Fm.

The sensing unit 170 extracts threshold voltage information of the driving transistor and/or degradation information of the organic light emitting diode from each pixel 140 during the sensing period. For example, the sensing unit 170 may extract threshold voltage information and/or degradation information of the pixels 140 for each horizontal line, corresponding to the control signal supplied to the control lines CL1 to CLn.

The timing controller 150 controls the scan driver 110, the data driver 120 and the control line driver 160. The timing controller 150 receives threshold voltage information and/or degradation information supplied from the sensing unit 170, and generates a second data data2 by changing a first data data1, corresponding to the supplied information.

Figure 3:
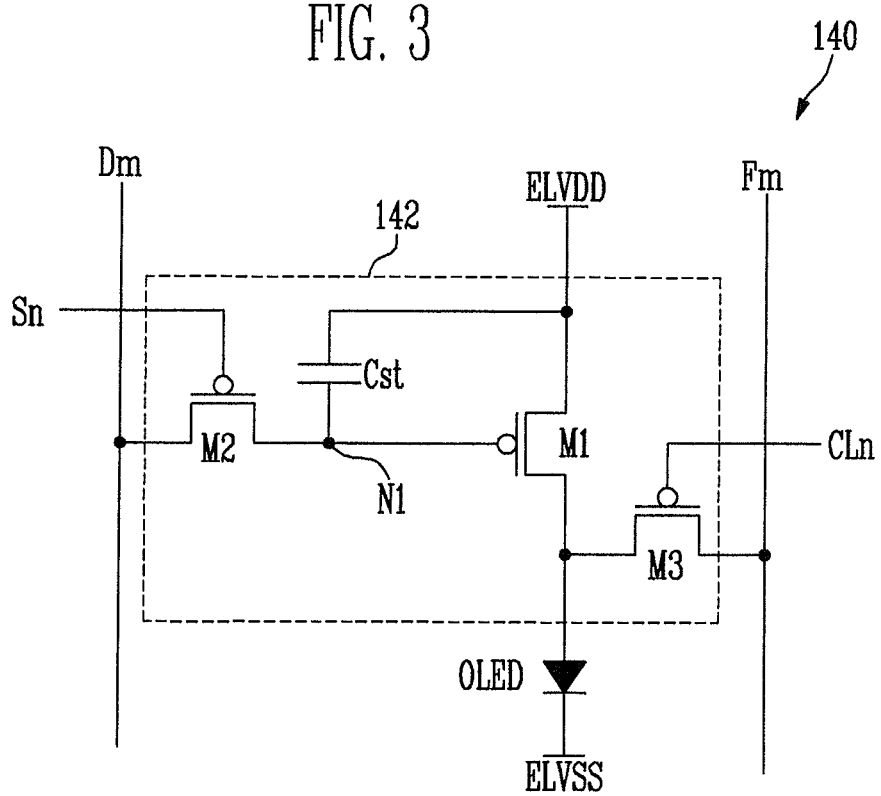
FIG. 3 is a circuit diagram illustrating a pixel according to an embodiment of the present invention.

FIG. 3 is a circuit diagram illustrating a pixel according to an embodiment of the present invention. For convenience of illustration, a pixel coupled to an m-th data line Dm and an n-th scan line Sn is shown in FIG. 3.

Although the pixel 140 having three transistors M1 to M3 and one capacitor Cst has been illustrated in FIG. 3, the present invention is not limited thereto. Practically, in the present invention, the pixel 140 may be selectively implemented as any one of various circuits currently known in the art, which can be electrically coupled to the sensing unit 170.

Referring to FIG. 3, the pixel 140 according to this embodiment includes an organic light emitting diode OLED, and a pixel circuit 142 controlling the amount of current supplied to the organic light emitting diode OLED.

An anode electrode of the organic light emitting diode OLED is coupled to the pixel circuit 142, and a cathode electrode of the organic light emitting diode OLED is coupled to the second ELVSS. The organic light emitting diode OLED generates light with a set or predetermined luminance, corresponding to current supplied from the pixel circuit 142.

The pixel circuit 142 supplies a set or predetermined current to the organic light emitting diode OLED, corresponding to a data signal. To this end, the pixel circuit 142 includes first to third transistors M1 to M3 and a storage capacitor Cst.

A first electrode of the first transistor M1 (driving transistor) is coupled to the first power source ELVDD, and a second electrode of the first transistor M1 is coupled to the anode electrode of the organic light emitting diode OLED. The first transistor M1 controls the amount of current supplied to the organic light emitting diode OLED, corresponding to the voltage applied to a first node N1.

A first electrode of the second transistor M2 is coupled to the data line Dm, and a second electrode of the second transistor M2 is coupled to the first node N1. A gate electrode of the second transistor M2 is coupled to the scan line Sn. When a scan signal is supplied to the scan line Sn, the second transistor M2 is turned on to electrically couple the data line Dm and the first node N1 to each other.

A first electrode of the third transistor M3 is coupled to the anode electrode of the organic light emitting diode OLED, and a second electrode of the third transistor M3 is coupled to a feedback line Fm. A gate electrode of the third transistor M3 is coupled to a control line CLn. When a control signal is supplied to the control line CLn, the third transistor M3 is turned on to electrically couple the feedback line Fm and the anode electrode of the organic light emitting diode OLED to each other.

The storage capacitor Cst is coupled between the first power source ELVDD and the first node N1. The storage capacitor Cst stores a voltage corresponding to the data signal.

Figure 4:
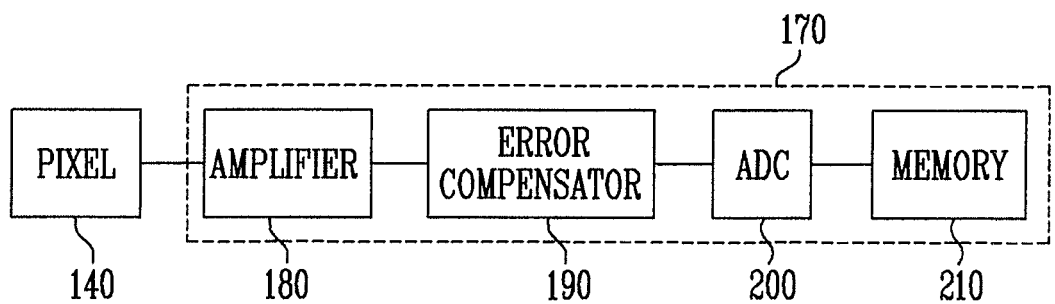
FIG. 4 is a block diagram illustrating an embodiment of a sensing unit shown in FIG. 2.

FIG. 4 is a block diagram illustrating an embodiment of the sensing unit shown in FIG. 2. For convenience of illustration, only one channel is shown in FIG. 4.

Referring to FIG. 4, the sensing unit 170 according to this embodiment includes an amplifier 180, an error compensator 190, an analog-digital converter (hereinafter, referred to as an "ADC") 200 and a memory 210. Here, the amplifier 180, the error compensator 190 and the like are formed for each channel, i.e., each of the feedback lines F1 to Fm. The ADC 200 may be formed for each channel or may be formed to share a plurality of channels. The memory 210 is commonly coupled to all the channels, so as to store threshold voltage information and/or degradation information extracted from each channel.

The amplifier 180 amplifies voltage (and/or current) extracted from each pixel 140. Practically, the amplifier 180 amplifies micro-voltage (and/or current) from each pixel 140 and supplies the amplified micro-voltage (and/or current) to the error compensator 190.

The error compensator 190 removes an error component (an offset characteristic, noise, resistive component, etc.) so that desired information can be extracted. Practically, the error compensator 190 supplies only desired information to the ADC 200 by removing an error component caused by internal circuits of the amplifier 180 and the error compensator 190. In this case, all error components caused by circuits between the pixel 140 and the ADC 200, including an error component included in the information (voltage and/or current) amplified in the amplifier 180, can be removed, and accordingly, it is possible to improve the reliability of the extracted information.

The ADC 200 converts, into a digital value, information supplied from the error compensator 190, e.g., analog voltage including threshold voltage information of the driving transistor and/or degradation information of the organic light emitting diode included in each pixel.

The digital value converted in the ADC 200 is stored in the memory 210. Practically, a digital value (threshold voltage information and/or degradation information) corresponding to each pixel is stored in the memory 210. The digital value stored in the memory 210 is supplied to the timing controller 150. The timing controller 150 generates the second data data2 by changing bits of the first data data1 so that the threshold voltage information of the driving transistor and/or the degradation information of the organic light emitting diode is included in each pixel, using the digital value stored in the memory 210.

Figure 5:
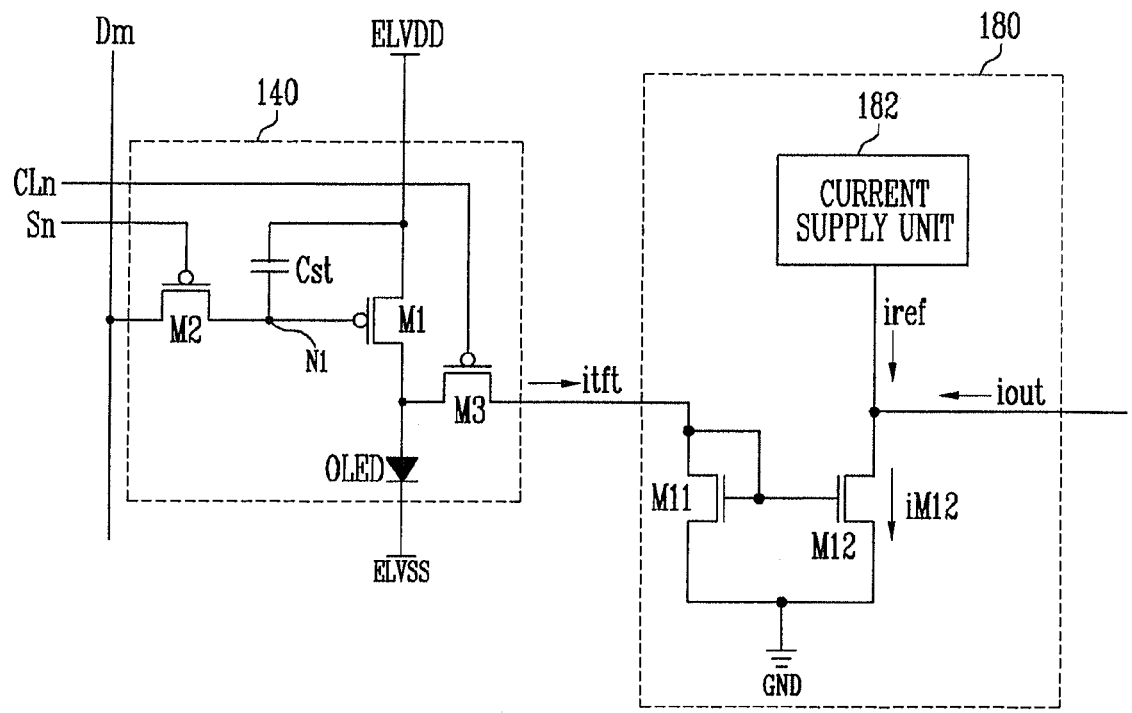
FIG. 5 is a circuit diagram illustrating an embodiment of an amplifier shown in FIG. 4.

FIG. 5 is a circuit diagram illustrating an embodiment of the amplifier shown in FIG. 4. Although transistors M11 and M12 are implemented as NMOS transistors in FIG. 5, the present invention is not limited thereto.

Referring to FIG. 5, the amplifier 180 includes a current supply unit 182, an eleventh transistor M11 and a twelfth transistor M12.

A second electrode of the eleventh transistor M11 is coupled to the pixel 140, and a first electrode of the eleventh transistor M11 is coupled to a ground power source GND. A gate electrode of the eleventh transistor M11 is coupled to its own second electrode. That is, the eleventh transistor M11 is diode-coupled so that current can flow from the pixel 140 to the ground power source GND.

The twelfth transistor M12 is coupled between the current supply unit 182 and the ground power source GND. A gate electrode of the twelfth transistor M12 is coupled to the gate electrode of the eleventh transistor M11. That is, the twelfth transistor M12 is coupled in the form of a current mirror to the eleventh transistor M11. A common node of the twelfth transistor M12 and the current supply unit 182 is coupled to the error compensator 190.

In the present invention, the twelfth transistor M12 is formed to have a channel width wider than that of the eleventh transistor M11 so that the amount of current can be amplified. For example, the twelfth transistor M12 may be set so that the channel width of the twelfth transistor M12 is i (i is an integer exceeding 1) times wider than that of the eleventh transistor M11.

The current supply unit 182 supplies a set or predetermined reference current iref to the twelfth transistor M12. Here, the reference current iref is set to have a previously fixed current value in the design process of the current supply unit 182. For example, the reference current iref is set to have a current value lower than that of current iM12 flowing through the twelfth transistor M12.

An operation process of the amplifier will be described in more detail. A specific data signal is supplied to the data lines D1 to Dm, corresponding to the scan signal progressively supplied to the scan lines S1 to Sn during the sensing period. A control signal is progressively supplied to the control lines CL1 to CLn during the sensing period. The voltage of the second power source ELVSS is controlled during the sensing period so that current does not flow in the organic light emitting diode OLED. Practically, in an embodiment of the present invention, the configuration in which the current provided to the sensing unit 170 via the first transistor M1 during the sensing period is applicable to all various types of configurations currently known in the art.

The specific data signal is supplied to the pixel circuit 142. If the third transistor M3 is turned on, a first current, i.e., pixel current itft is supplied from the first transistor M1 to the amplifier 180. Here, the pixel current itft is determined, corresponding to the threshold voltage and mobility of the first transistor. M1 included in each pixel.

The first current itft supplied from the pixel circuit 142 is supplied to the ground power source GND via the diode-coupled eleventh transistor M11. In this case, the second current iM12, which is i times greater than the pixel current itft, flows through the twelfth transistor M12 coupled in the form of the current mirror to the eleventh transistor M11. Since the second current iM12 is set to be greater than the reference current iref, a third current iout is supplied from the error compensator 190.

Here, the reference current iref is set (or predetermined) to have a low current value, corresponding to the specific data signal. Then, the third current Iout is set to have a current value higher than that of the first current itft. That is, the amplifier 180 generates the third current Iout that is a high current value, using the first current itft that is a micro-current.

Figure 6:
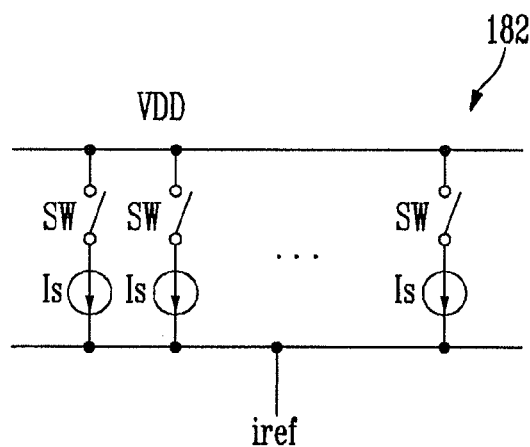
FIG. 6 is a circuit diagram illustrating an embodiment of a current supply unit shown in FIG. 5.

FIG. 6 is a circuit diagram illustrating an embodiment of the current supply unit shown in FIG. 5.

Referring to FIG. 6, the current supply unit 182 according to this embodiment includes a plurality of current sources Is, and a switch SW coupled between each current source Is and a third power source VDD.

The current source Is supplies a set current. The switch SW is coupled between the third power source VDD and each current power source Is so as to control whether the current is supplied from the current source Is. Practically, the turn-on/turn-off of the switch SW is controlled so that a desired reference current iref can be supplied, in consideration of characteristics of a panel, etc.

Figure 7:
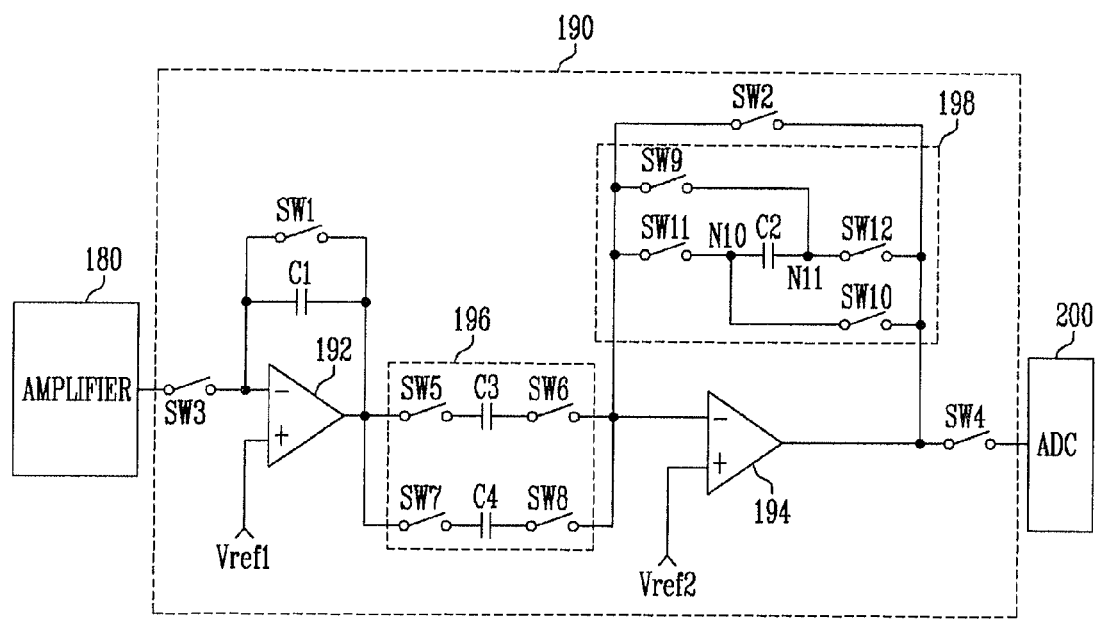
FIG. 7 is a circuit diagram illustrating an error compensator according to an embodiment of the present invention.

FIG. 7 is a circuit diagram illustrating an error compensator according to an embodiment of the present invention.

Referring to FIG. 7, the error compensator 190 according to this embodiment includes a first operational amplifier (OP-AMP) 192, a second OP-AMP 194, a first switch SW1, a second switch SW2, a third switch SW3, a fourth switch SW4, a first capacitor C1, a first storage unit 196 and a second storage unit 198.

A first input terminal (negative input terminal: −) of the first OP-AMP 192 is coupled to the amplifier 180 via the third switch SW3, and a second input terminal (positive input terminal: +) of the first OP-AMP 192 receives a first reference voltage Vref1. A first output terminal of the first OP-AMP 192 is coupled to the first storage unit 196. The first OP-AMP 192 provides the first storage unit 196 with the voltage input from the amplifier 180 while being operated as a buffer or integrator.

The first switch SW1 is coupled between the first input terminal (−) and the first output terminal of the first OP-AMP 192. In a case where the first switch SW1 is turned on, the first OP-AMP 192 is driven as a buffer. In a case where the first switch SW1 is turned off, the first OP-AMP 192 is driven as an integrator. To this end, the first capacitor C1 is coupled in parallel to the first switch SW1 between the first input terminal (−) and the first output terminal of the first OP-AMP 192.

The third switch SW3 is coupled between the first input terminal (−) of the first OP-AMP 192 and the amplifier 180. The third switch SW3 controls the electrical coupling between the first OP-AMP 192 and the amplifier 180 while being turned on and turned off.

In addition, when the third switch SW3 is turned on, the third current iout described above is supplied to the amplifier 180. Here, the third current Iout is supplied from a virtual current source (or voltage source). The first OP-AMP 192 inversely amplifies a voltage corresponding to the third current iout and provides the inversely amplified voltage to the first storage unit 196.

A first input terminal (−) of the second OP-AMP 194 is coupled to the first storage unit 196, and a second input terminal (+) of the second OP-AMP 194 receives a second reference voltage Vref2. A second output terminal of the second OP-AMP 194 is coupled to the ADC 200 via the fourth switch SW4. The second OP-AMP 194 supplies the voltage provided from the first storage unit 196 to the ADC 200 while being operated as a buffer or integrator.

The second switch SW2 is coupled between the first input terminal (−) and the second output terminal of the second OP-AMP 194. In a case where the second switch SW2 is turned on, the second OP-AMP 194 is driven as a buffer. In a case where the second switch SW2 is turned off, the second OP-AMP 194 is driven as an integrator. Meanwhile, in an embodiment of the present invention, the first and second reference voltages Vref1 and Vref2 are experimentally determined as reference voltages for inversion amplification, in consideration of the characteristics of the panel.

The fourth switch SW4 is coupled between the second output terminal of the second OP-AMP 194 and the ADC 200. The fourth switch SW4 controls the electrical coupling between the second OP-AMP 194 and the ADC 200 while being turned on and turned off.

The first storage unit 196 is coupled between the first output terminal and the first input terminal (−) of the first OP-AMP 192. Error component existing between the third switch SW3 and the ADC 200, e.g., offsets, line resistances, noises and element characteristics of the first and second OP-AMPs 192 and 194 are stored in the first storage unit 196. To this end, the first storage unit 196 includes a fifth switch SW5, a third capacitor C3 and a sixth switch SW6, which are coupled in parallel between the first output terminal and the first input terminal (−) of the first OP-AMP 192, and a seventh switch SW7, a fourth capacitor C4 and an eighth switch SW8, which are coupled in parallel to the fifth switch SW5, the third capacitor C3 and the sixth switch SW6 between the first output terminal and the first input terminal (−) of the first OP-AMP 192.

The fifth and sixth switches SW5 and SW6 store an error component in the third capacitor C3 while being simultaneously turned on. The seventh and eighth switches SW7 and SW8 store an error component in the fourth capacitor C4 while being turned on at a time different from that when the fifth switch SW5 is turned on.

The second storage unit 198 stores a voltage corresponding to the third current iout, except the error component stored in the first storage unit 196 and the error component of the amplifier 180 (circuit characteristics and error components for amplification). To this end, the first storage unit 196 includes a second capacitor C2, and ninth to twelfth switches SW9 to SW12.

The second capacitor C2 is coupled between tenth and eleventh nodes N10 and N11. The second capacitor C2 stores a specific voltage except error components.

The eleventh switch SW11 is coupled between the tenth node N10 and the first input terminal (−) of the second OP-AMP 194. The twelfth switch SW12 is coupled between the eleventh node N11 and the second output terminal of the second OP-AMP 194. The eleventh and twelfth switches SW11 and SW12 store a predetermined voltage in the second capacitor C2 while being simultaneously turned on and turned off.

The ninth switch SW9 is coupled between the eleventh node N11 and the first input terminal (−) of the second OP-AMP 194. The tenth switch SW10 is coupled between the tenth node N10 and the second output terminal of the second OP-AMP 194. The ninth and tenth switches SW9 and SW10 store a set voltage in the second capacitor C2 while being simultaneously turned on and turned off. Here, the turn-on periods of the ninth and eleventh switches SW9 and SW11 do not overlap with each other.

Figure 8:
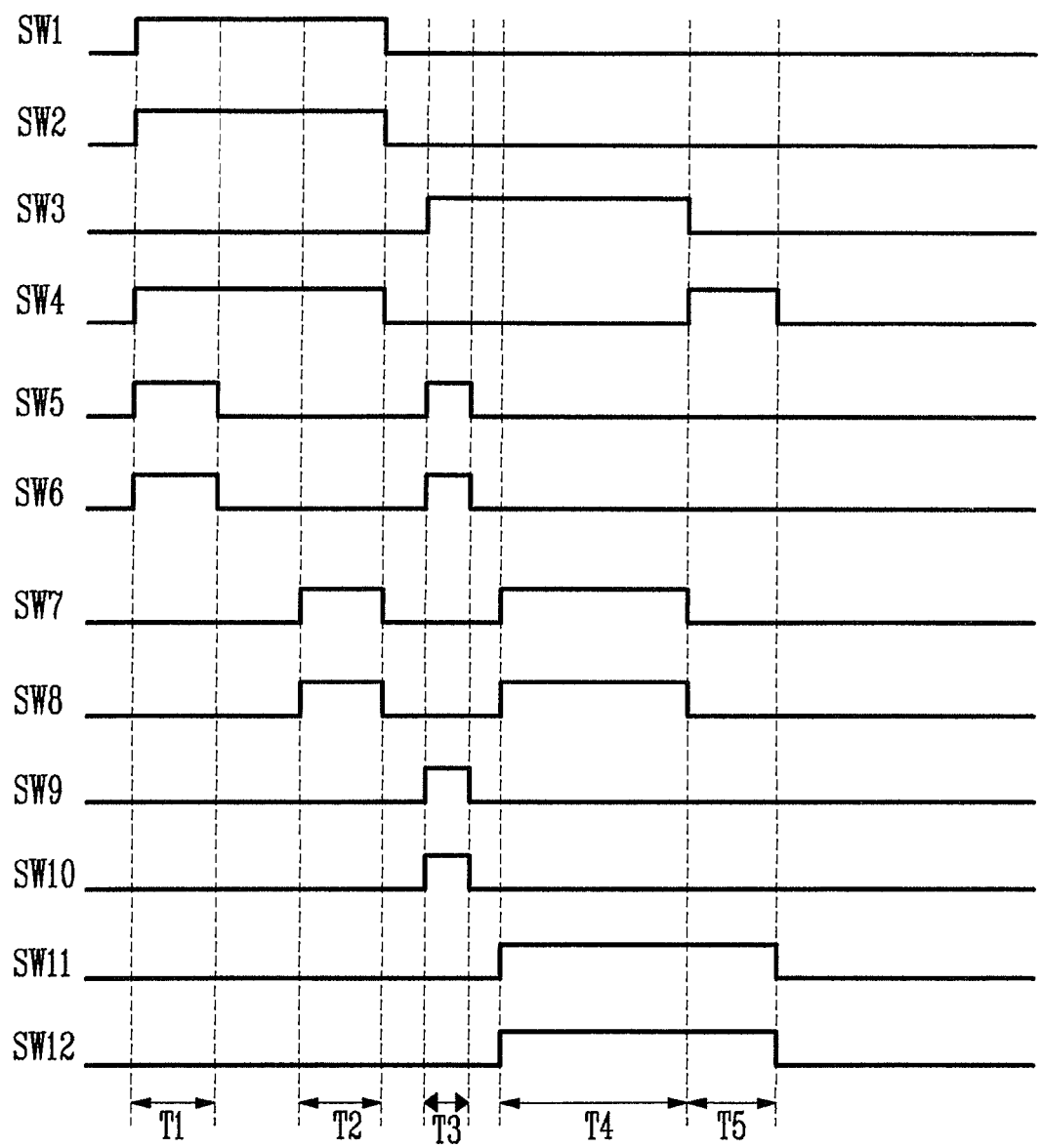
FIG. 8 is a waveform diagram illustrating an operation process of the error compensator shown in FIG. 7.

FIG. 8 is a waveform diagram illustrating an operation process of the error compensator shown in FIG. 7.

Referring to FIG. 8, the first switch SW1, the second switch SW2, the fourth switch SW4, the fifth switch SW5 and the sixth switch SW6 are turned on during a first period T1.

If the fourth switch SW4 is turned on, the ADC 200 and the second output terminal of the second OP-AMP 194 are electrically coupled to each other.

If the first switch SW1 is turned on, the first OP-AMP 192 is coupled in the form of a buffer. Then, the first reference voltage Vref1 is applied to the first output terminal of the first OP-AMP 192 due to virtual ground characteristics of the OP-AMP.

If the second switch SW2 is turned on, the second OP-AMP 194 is coupled in the form of a buffer. Then, the second reference voltage Vref2 is applied to the second output of the second OP-AMP 194 due to the virtual ground characteristics of the OP-AMP.

If the fifth switch SW5 is turned on, the first output terminal of the first OP-AMP 192 and one terminal of the third capacitor C3 are electrically coupled to each other. If the sixth switch SW6 is turned on, the second output terminal of the second OP-AMP 194 and the other terminal of the third capacitor C3 are electrically coupled to each other. In this case, the third capacitor C3 ideally stores a voltage corresponding to the difference between the first and second reference voltages Vref1 and Vref2. However, practically, a set voltage including error components (e.g., offsets, line resistances, noises and element characteristics of the OP-AMPs) is stored in the third capacitor C3. Practically, error components from the third switch SW3 to the ADC 200 are stored in the form of voltage in the third capacitor C3 during the first period T1.

The first switch SW1, the second switch SW2, the fourth switch SW4, the seventh switch SW7 and the eighth switch SW8 are turned on during a second period T2.

If the first switch SW1 is turned on, the first reference voltage Vref1 is applied to the first output terminal of the first OP-AMP 192. If the second switch SW2 is turned on, the second reference voltage Vref2 is applied to the second output terminal of the second OP-AMP 194.

If the seventh switch SW7 is turned on, the first output terminal of the first OP-AMP 192 and one terminal of the fourth capacitor C4 are electrically coupled to each other. If the eighth switch SW8 is turned on, the other terminal of the fourth capacitor C4 and the second output terminal of the second OP-AMP 194 are electrically coupled to each other. In this case, a set voltage including an error component of the error compensator 190 is charged in the fourth capacitor C4. For example, the same voltage as that of the third capacity C3 is stored in the fourth capacitor C4. Subsequently, for convenience of illustration, it is assumed that the same voltage is stored in the third and fourth capacitors C3 and C4.

The third switch SW3, the fifth switch SW5, the sixth switch SW6, the ninth switch SW9 and the tenth switch SW10 are turned on during a third period T3. The third period is set to be a short time period so that only the error component of the amplifier 180 is supplied to the error compensator 190. In other words, the third switch SW3 is instantaneously turned on and then turned off so that the voltage corresponding to the third current Iout is not applied to the first input terminal (−) of the first OP-AMP 192.

Then, a set voltage including the error component of the amplifier 180 is applied to the first input terminal (−) of the first OP-AMP 192 during the third period T3. The first OP-AMP 192 inversely amplifies a predetermined voltage and supplies a first voltage to the first output terminal of the first OP-AMP 192 while being driven as an integrator during the third period T3.

The first voltage output to the first output terminal of the first OP-AMP 192 is supplied to the first input terminal (−) of the second OP-AMP 194 by coupling of the third capacitor C3. In this case, the first voltage is changed into a second voltage, corresponding to the voltage stored in the third capacitor C3. Here, an error component of the error compensator 190 is additionally included in the second voltage. Meanwhile, since the ninth and tenth switches SW9 and SW10 are turned on, the second voltage is stored in the second capacitor C2. Subsequently, for convenience of illustration, it is assumed that when the eleventh node N11 is coupled to the first input terminal (−) of the second OP-AMP 194, a voltage in the reverse direction is stored in the second capacitor C2. In addition, it is assumed that when the tenth node N10 is coupled to the first input terminal (−) of the second OP-AMP 194, a voltage in the forward direction is stored in the second capacitor C2. In this case, the second voltage in the reverse direction is stored in the second capacitor C2 during the third period T3.

Subsequently, the third switch SW3, the seventh switch SW7, the eighth switch SW8, the eleventh switch SW11 and the twelfth switch SW12 are turned on during a fourth period T4. Here, the fourth period T4 is set to a period wider than the third period T3.

If the third switch SW3 is turned on during the fourth period T4, a third voltage corresponding to the third current Iout is applied to the first input terminal (−) of the first OP-AMP 192. Here, the fourth period T4 is set to a sufficiently wide time so that the third voltage can be stably applied. The first OP-AMP 192 inversely amplifies the third voltage and supplies the inversely amplified voltage to the first output terminal of the first OP-AMP 192 while being driven as an integrator during the fourth period T4. The voltage supplied to the first output terminal of the first OP-AMP 192 is changed into a fourth voltage by coupling of the fourth capacitor C4 so that the fourth voltage is supplied to the first input terminal (−) of the second OP-AMP 194. In this case, the eleventh and twelfth switches SW11 and SW12 are turned on, and hence the fourth voltage in the forward direction is stored in the second capacitor C2.

Meanwhile, the error components are offset by the second voltage in the reverse direction, stored in the second capacitor C2 during the third period T3, and the fourth voltage in the forward direction, stored in the second capacitor C2 during the fourth period T4. In other words, a set voltage corresponding to the third, current Iout is charged in the second capacitor C2 during the fourth period T4, regardless of the error components of the amplifier 180 and the error compensator 190.

Subsequently, the fourth switch SW4, the eleventh switch SW11 and the twelfth switch SW12 are turned on during a fifth period T5. If the fourth switch SW4 is turned on, the ADC 200 and the second output terminal of the second OP-AMP 194 are electrically coupled to each other. If the eleventh switch SW11 is turned on, the tenth node N10 is coupled to the first input terminal (−) of the second OP-AMP 194. If the twelfth switch SW12 is turned on, the eleventh node N11 is coupled to the second output terminal of the second OP-AMP 194. Then, the second OP-AMP 194 supplies, to the ADC 200, a set voltage corresponding to the set voltage stored in the second capacitor C2. The ADC 200 converts a set voltage supplied thereto into a digital value, and stores the converted digital value in the memory 210.

Practically, in an embodiment of the present invention, the threshold voltage and mobility information of the driving transistor included in each pixel 140 is extracted by repeating the aforementioned procedure during the sensing period. As described above, in an embodiment of the present invention, only pure information from which the error components of the amplifier 180 and the error compensator 190 are removed may be extracted, and accordingly, the accuracy of compensation can be improved. In addition, the error compensator 190 according to this embodiment is used to extract only a desired voltage by removing error components, and can be applied to various circuits for amplifying a predetermined current and/or voltage.

Figure 9:
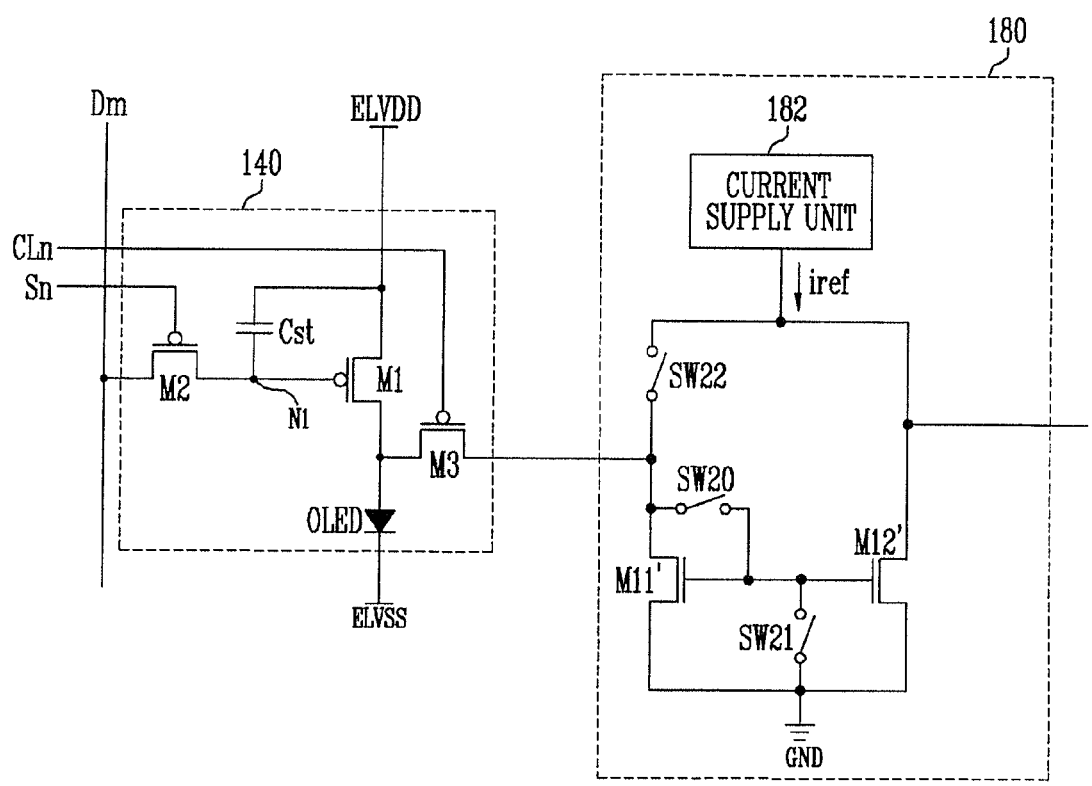
FIG. 9 is a circuit diagram illustrating another embodiment of the amplifier.

FIG. 9 is a circuit diagram illustrating another embodiment of the amplifier. In FIG. 9, components identical to those of FIG. 5 are designated by like reference numerals, and their detailed descriptions will be omitted.

Referring to FIG. 9, the amplifier 180 according to this embodiment includes a current supply unit 182, an eleventh transistor M11', a twelfth transistor M12', a twentieth switch SW20, a twenty-first switch SW21 and a twenty-second switch 22.

The eleventh transistor M11' is coupled between the pixel 140 and the ground power source GND. The twentieth switch SW20 is formed between the pixel 140 and a gate electrode of the eleventh transistor M11'. When the twentieth switch SW20 is turned on, the eleventh transistor M11' is diode-coupled so that current can flow from the pixel 140 and the ground power source GND.

The twelfth transistor M12' is coupled between the current supply unit 182 and the ground power source GND. A gate electrode of the twelfth transistor M12' is coupled to the gate electrode of the eleventh transistor M11'. That is, the twelfth transistor M12' is coupled in the form of a current mirror to the eleventh transistor M11'.

The twenty-first switch SW21 is coupled between the gate electrode of the eleventh transistor M11' and the ground power source GND. If the twenty-first switch SW21 is turned on, the ground power source GND is supplied to the gate electrodes of the eleventh and twelfth transistors M11' and M12', and accordingly, the eleventh and twelfth transistors M11' and M12' are turned off.

The twenty-second switch SW22 is formed between the pixel 140 and a common terminal of the current supply unit 182 and the error compensator 190. If the twenty-second switch SW22 is turned on, the pixel 140, the current supply unit 182 and the error compensator 190 are electrically coupled to one another.

Figure 10:
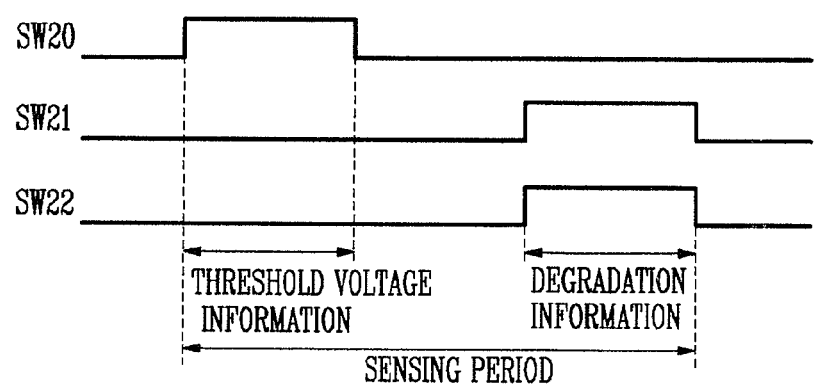
FIG. 10 is a waveform diagram illustrating an operation process of the amplifier shown in FIG. 9.

FIG. 10 is a waveform diagram illustrating an operation process of the amplifier shown in FIG. 9.

Referring to FIG. 10, it is assumed that the third transistor M3 included in the pixel 140 is first turned on during the sensing period.

The twentieth switch SW20 is turned on during a period in which the threshold voltage information of the first transistor M1 is extracted in the sensing period. If the twentieth switch SW20 is turned on, the eleventh transistor M11' is diode-coupled. In this case, the amplifier 180 shown in FIG. 9 is driven identically to the amplifier 180 shown in FIG. 4, and therefore, its detailed description will be omitted.

The twenty-first and twenty-second switches SW21 and SW22 are turned on during a period in which the degradation information of the organic light emitting diode OLED is extracted in the sensing period. If the twenty-first switch SW21 is turned on, the eleventh and twelfth transistors M11' and M12' are turned off.

If the twenty-second switch SW22 is turned on, the reference current iref from the current supply unit 182 is supplied to the second power source ELVSS via the anode electrode of the organic light emitting diode OLED. In this case, a set voltage corresponding to the reference current iref is applied to the organic light emitting diode OLED.

The resistance is changed corresponding to the degree of degradation of the organic light emitting diode OLED, and accordingly, degradation information is included in the set voltage applied to the organic light emitting diode OLED, corresponding to the reference current iref. The set voltage applied to the organic light emitting diode OLED is supplied to the error compensator 190.

That is, the amplifier 180 according to this embodiment can extract the degradation information of the organic light emitting diode OLED and the threshold voltage information of the first transistor M1 from the pixel 140 while being driven as a current source or current sink source. In addition, the operation process of the error compensator 190 is identical to that described above, and therefore, its detailed description will be omitted.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
   a plurality of pixels each having a driving transistor and an organic light emitting diode; and
   a sensing unit for extracting at least one of a first information including a threshold voltage of the driving transistor or a second information including a degradation of the organic light emitting diode from a pixel of the pixels,
   wherein the sensing unit includes:
      an amplifier for amplifying a voltage corresponding to the at least one of the first information or the second information;
      an error compensator for compensating for error components of elements included in the amplifier and the error compensator; and
      an analog-digital converter for converting an output of the error compensator,
   wherein the error compensator is coupled between the amplifier and the analog-digital converter, the error compensator comprising:
      a first operational amplifier (OP-AMP) and a second OP-AMP;
      a first switch and a first capacitor, coupled in parallel between a first input terminal and an output terminal of the first OP-AMP;
      a second switch coupled between a first input terminal and an output terminal of the second OP-AMP;
      a first storage unit coupled between the output terminal of the first OP-AMP and the first input terminal of the second OP-AMP, and for changing a voltage at the output terminal of the first OP-AMP and supplying the changed voltage to the first input terminal of the second OP-AMP; and
      a second storage unit coupled between the first input terminal and the output terminal of the second OP-AMP, and
   wherein the second storage unit comprises:
      a second capacitor coupled between tenth and eleventh nodes;
      a ninth switch coupled between the eleventh node and the first input terminal of the second OP-AMP;

a tenth switch coupled between the tenth node and the output terminal of the second OP-AMP;
an eleventh switch coupled between the tenth node and the first input terminal of the second OP-AMP; and
a twelfth switch coupled between the eleventh node and the output terminal of the second OP-AMP.

2. The organic light emitting display device of claim 1, wherein the error components include offset characteristics, noises and line resistances of the elements.

3. The organic light emitting display device of claim 1, wherein the amplifier includes:
an eleventh transistor comprising a second electrode coupled to the pixel, a first electrode coupled to a ground power source, and a gate electrode coupled to the second electrode so that current flows from the pixel to the ground power source;
a twelfth transistor coupled in the form of a current mirror to the eleventh transistor; and
a current supply unit for supplying a reference current to the eleventh transistor.

4. The organic light emitting display device of claim 3, wherein the twelfth transistor is formed to have a channel width wider than that of the eleventh transistor.

5. The organic light emitting display device of claim 3, wherein the reference current is set to have a current value lower than that of a second current to be flowed in the twelfth transistor, the second current mirroring a first current supplied to the eleventh transistor.

6. The organic light emitting display device of claim 3, wherein a common terminal of the current supply unit and the twelfth transistor is coupled to the error compensator.

7. The organic light emitting display device of claim 3, wherein the amplifier further includes:
a twentieth switch positioned between the gate electrode and the second electrode of the eleventh transistor;
a twenty-first switch coupled between the ground power source and the gate electrodes of the eleventh and twelfth transistors; and
a twenty-second switch coupled between the pixel and a common terminal of the current supply unit and the twelfth transistor.

8. The organic light emitting display device of claim 7, wherein the twentieth switch is configured to be turned on during a period in which the first information is extracted, and the twenty-first and twenty-second switches are configured to be turned on during a period in which the second information is extracted.

9. The organic light emitting display device of claim 1, wherein the error compensator includes:
a first operational amplifier (OP-AMP) and a second OP-AMP;
a first switch and a first capacitor, coupled in parallel between a first input terminal and an output terminal of the first OP-AMP;
a second switch coupled between a first input terminal and an output terminal of the second OP-AMP;
a third switch coupled between the first input terminal and the amplifier;
a fourth switch coupled between the analog-digital converter and the output terminal of the second OP-AMP;
a first storage unit coupled between the output terminal of the first OP-AMP and the first input terminal of the second OP-AMP; and
a second storage unit coupled between the first input terminal and the output terminal of the second OP-AMP.

10. The organic light emitting display device of claim 9, wherein a first reference power source is supplied to a second input terminal of the first OP-AMP, and a second reference power source is supplied to a second input terminal of the second OP-AMP.

11. The organic light emitting display device of claim 9, wherein the first storage unit includes:
a fifth switch, a third capacitor and a sixth switch, coupled in series between the output terminal of the first OP-AMP and the first input terminal of the second OP-AMP; and
a seventh switch, a fourth capacitor and an eighth switch, coupled in parallel to the fifth switch, the third capacitor and the sixth switch, between the output terminal of the first OP-AMP and the first input temiinal of the second OP-AMP.

12. The organic light emitting display device of claim 11, wherein the fifth and sixth switches are configured to be turned on during a first period in the period in which the first and second switches are turned on, and the seventh and eighth switches are configured to be turned on during a second period not overlapping with the first period in the period in which the first and second switches are turned on.

13. The organic light emitting display device of claim 12, wherein the fourth switch is configured to be also set to be in a turn-on state during the first and second periods.

14. An organic light emitting display device, comprising:
a plurality of pixels each having a driving transistor and an organic light emitting diode; and
a sensing unit for extracting at least one of a first information including a threshold voltage of the driving transistor or a second information including a degradation of the organic light emitting diode from a pixel of the pixels,
wherein the sensing unit includes:
an amplifier for amplifying a voltage corresponding to the at least one of the first information or the second information; and
an error compensator for compensating for error components of elements included in the amplifier and the error compensator,
wherein the error compensator includes:
a first operational amplifier (OP-AMP) and a second OP-AMP;
a first switch and a first capacitor, coupled in parallel between a first input terminal and an output terminal of the first OP-AMP;
a second switch coupled between a first input terminal and an output terminal of the second OP-AMP;
a third switch coupled between the first input terminal and the amplifier;
a fourth switch coupled between an external analog-digital converter and the output terminal of the second OP-AMP;
a first storage unit coupled between the output terminal of the first OP-AMP and the first input terminal of the second OP-AMP; and
a second storage unit coupled between the first input terminal and the output terminal of the second OP-AMP,
wherein the first storage unit includes:
a fifth switch, a third capacitor and a sixth switch, coupled in series between the output terminal of the first OP-AMP and the first input terminal of the second OP-AMP; and
a seventh switch, a fourth capacitor and an eighth switch, coupled in parallel to the fifth switch, the third capacitor and the sixth switch, between the output terminal of the first OP-AMP and the first input terminal of the second OP-AMP, and wherein the second storage unit includes:
a second capacitor coupled between tenth and eleventh nodes;
a ninth switch coupled between the eleventh node and the first input terminal of the second OP-AMP;
a tenth switch coupled between the tenth node and the output terminal of the second OP-AMP;
an eleventh switch coupled between the tenth node and the first input terminal of the second OP-AMP; and
a twelfth switch coupled between the eleventh node and the output terminal of the second OP-AMP.

15. The organic light emitting display device of claim 14, wherein the fifth switch, the sixth switch, the ninth switch and the tenth switch are configured to be turned on during a third period in the period in which the third switch is turned on, and the seventh switch, the eighth switch, the eleventh switch and the twelfth switch are configured to be turned on during a fourth period not overlapping with the third period in the period in which the third switch is turned on.

16. The organic light emitting display device of claim 15, wherein the fourth period is set to be longer than the third period.

17. The organic light emitting display device of claim 15, wherein the fourth switch, the eleventh switch and the twelfth switch are configured to be turned on during a period after the fourth period.

18. The organic light emitting display device of claim 1, further comprising:
a data driver for supplying a data signal to data lines coupled to the pixels;
a scan driver for supplying a scan signal to scan lines coupled to the pixels; and
a timing controller for changing bits of data supplied from the outside thereof and providing the data driver with the changed bits, corresponding to the at least one of the first information or the second information.

19. The organic light emitting display device of claim 18, wherein the sensing unit further includes:
the analog-digital converter for converting a voltage supplied from the error compensator into a digital value; and
a memory for storing the digital value and providing the stored value to the timing controller so that the bits of the data are changed.

20. The organic light emitting display device of claim 1, wherein each of the pixels includes another transistor coupled between the sensing unit and a common node between the driving transistor and the organic light emitting diode, and is configured to be turned on during the period in which the at least one of the first information or the second information is extracted.

21. An error compensator, comprising:
a first operational amplifier (OP-AMP) and a second OP-AMP;
a first switch and a first capacitor, coupled in parallel between a first input terminal and an output terminal of the first OP-AMP;
a second switch coupled between a first input terminal and an output terminal of the second OP-AMP;
a first storage unit coupled between the output terminal of the first OP-AMP and the first input terminal of the second OP-AMP, and for changing a voltage at the output terminal of the first OP-AMP and supplying the changed voltage to the first input terminal of the second OP-AMP; and
a second storage unit coupled between the first input terminal and the output terminal of the second OP-AMP,
wherein the second storage unit comprises:
a second capacitor coupled between tenth and eleventh nodes;
a ninth switch coupled between the eleventh node and the first input terminal of the second OP-AMP;
a tenth switch coupled between the tenth node and the output terminal of the second OP-AMP;
an eleventh switch coupled between the tenth node and the first input terminal of the second OP-AMP; and
a twelfth switch coupled between the eleventh node and the output terminal of the second OP-AMP.

22. The error compensator of claim 21, wherein a first reference power source is supplied to a second input terminal of the first OP-AMP, and a second reference power source is supplied to a second input terminal of the second OP-AMP.

23. The error compensator of claim 22, wherein the first input terminal is a negative (−) input terminal, and the second input terminal is a positive (+) input terminal.

24. The error compensator of claim 21, wherein the first storage unit includes:
a fifth switch, a third capacitor and a sixth switch, coupled in series between the output terminal of the first OP-AMP and the first input terminal of the second OP-AMP; and
a seventh switch, a fourth capacitor and an eighth switch, coupled in parallel to the fifth switch, the third capacitor and the sixth switch between the output terminal of the first OP-AMP and the first input terminal of the second OP-AMP.

25. The error compensator of claim 24, wherein the fifth and sixth switches are configured to be turned on during a first period in the period in which the first and second switches are turned on, and the seventh and eighth switches are configured to be turned on during a second period not overlapping with the first period in the period in which the first and second switches are turned on.

26. The error compensator of claim 24, wherein, after a set voltage is charged in the third and fourth capacitors, the fifth switch, the sixth switch, the ninth switch and the tenth switch are configured to be turned on so that a voltage is primarily stored in the second capacitor, and the seventh switch, the eighth switch, the eleventh switch and the twelfth switch are configured to be turned on so that a voltage is secondarily stored in the second capacitor.

* * * * *